(12) United States Patent  
Nguyen-Huu et al.

(10) Patent No.: US 7,262,411 B2
(45) Date of Patent: Aug. 28, 2007

(54) DIRECT COLLECTION TRANSMISSION ELECTRON MICROSCOPY

(75) Inventors: Xuong Nguyen-Huu, San Diego, CA (US); Mark H. Ellisman, Solana Beach, CA (US); Stuart Kleinfelder, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/295,148

(22) Filed: Dec. 6, 2005

(65) Prior Publication Data

US 2006/0169901 A1 Aug. 3, 2006

Related U.S. Application Data

(60) Provisional application No. 60/634,408, filed on Dec. 8, 2004.

(51) Int. Cl.
*H01J 37/22* (2006.01)
(52) U.S. Cl. ........................ 250/310; 250/397
(58) Field of Classification Search ............... 250/310, 250/397; 257/431
See application file for complete search history.

(56) References Cited

U.S. PATENT DOCUMENTS 6,285,018 B1 * 9/2001 Aebi et al. ............... 250/214.1
2006/0278943 A1 * 12/2006 Turchetta et al. ........... 257/431

FOREIGN PATENT DOCUMENTS

WO WO 2004-099740 11/2004

OTHER PUBLICATIONS

P.A. Thuman-Commike and W. Chiu, "Reconstruction Principles of Icosahedral Virus Structure Determination using Electron Microscopy," *Micron*, vol. 31, 2000, pp. 687-711.
B. Bottcher, S.A. Wynne and R.A. Crowther, "Determination of the Fold of the Core Protein of Hepatitis B Virus by Electron Cryomicroscopy", *Nature*, vol. 386, Mar. 1997, pp. 88-94.
I.S. Gabashvili, R.K. Agrawal, C.M. Spahn, R.A. Grassucci, D.I. Svergun, J. Frank, P. Penczek, "Solution Structure of the *E. coli* 70S Ribosome at 11.5 A Resolution," *Cell*, vol. 100, Mar. 3, 2000, pp. 537-549.
J. Frank et al., "Three-Dimensional Cryoelectron Microscopy of Ribosomes," *Method of Enzymology.*, vol. 317, 2000, pp. 276-291.

(Continued)

*Primary Examiner*—Kiet T. Nguyen
(74) *Attorney, Agent, or Firm*—Greer, Burns & Crain, Ltd.

(57) ABSTRACT

A preferred method for transmission electron microscopy includes a step of generating a microscopy signal. The microscopy signal is then detected with an active pixel detector that includes a plurality of pixels. Each of the pixels includes at least one photodiode. Each pixel integrates an incident signal over a collection time period. Using a massively parallel on chip analog to digital conversion, very fast read out times can be achieved, e.g., many frames per second. In a preferred embodiment, the read out time permits there to be a single electron event recorded per pixel, indicating either a single electron or the lack thereof. This permits simple accumulation of the pixel counts for each pixel in read-out and storage electronics.

18 Claims, 7 Drawing Sheets

OTHER PUBLICATIONS

A.R. Faruqi, M.N. Andrews, "Cooled CCD Camera with Tapered Fibre Optics for Electron Microscopy," *Nucl. Inst. and Meth.*, vol. A392, 1997, p. 233-236.

G.Y. Fan, P. Datte, E. Beuville, J.F. eche, J. Millaud, K.H. Downing, F.T. Burkard, M.H. Ellisman, N.H. Xuong, "ASIC-Based Event-Driven 2D Digital Electron Counter for TEM Imaging", *Ultramicroscopy*, vol. 70, 1998, pp. 107-113.

A.R. Faruqi, D.M. Cattermole, R. Henderson, B. Mikulec, C. Raeburn, "Evaluation of a Hybrid Pixel Detector for Electron Microscopy", *Ultramicroscopy*, vol. 94, 2002, pp. 263-276.

R. Turchetta et al., "A Monolithic Active Pixel Sensor for Charge Particle Tracking and Imaging Using Standard VLSI CMOS Technology", *Nuclear Instruments and Methods in Physics Research A*, vol. A458, 2001, pp. 677-689.

G. Claus et al., "Particle Tracking Using CMOS Monolithic Active Pixel Sensor", *Nuclear Instruments and Methods in Physics Research A*, vol. A465, 2001, pp. 120-124.

S. Kleinfelder et al., "Integrated X-Ray and Charged Particle Active Pixel CMOS Sensor Arrays Using an Epitaxial Silicon Sensitive Region", *Proc. of the SPIE Hard X-Ray and Gamma Ray Detector, Physics IV*, Jul. 2002, pp. 208-217.

H.S. Matis et al., "Charged Particle Detection Using a CMOS Active Pixel Sensor" LBNL-51911, Dec. 2002, 6 pp. Presented at IEEE 2002 Nuclear Science Symposium (NSS) and Medical Imaging Conference (MIC) and Symposium on Nuclear Power Systems, Norfolk, Virginia, Nov. 10-16, 2002. Published in *IEEE Trans. Nucl. Sci.*, vol. 50, 2003, pp. 1020-1025.

G.Y. Fan and M.H. Ellisman, "Digital Imaging in Transmission Electron Microscopy," *Journal of Microscopy*, vol. 200 (2000), p. 1-13.

G.Y. Fan, S. Peltier, S. Lamont, D. Dunkelberger, B. Burke, M.H. Ellisman, Multiport-Readout Frame-Transfer 5 Megapixel CCD Imaging System for TEM applications, *Ultramicroscopy*, vol. 84, 2000, p. 75-84.

B. Dierickx, G. Meynants, D. Scheffer, "Near 100% fill factor CMOS active pixels," IEEE CCD & AIS workshop, Brugge, Belgium, Jun. 5-7, 1997, Proceedings p. P1.

G. Meynants, B. Dierickx and D. Scheffer, "CMOS active pixel image sensor with CCD performance," APFAEC Europto/SPIE, Zurich, May 18-21, 1998; Proc. SPIE 3410, 1998, pp. 68-76.

S. Kleinfelder, F. Bieser, Y. Chen, R. Gareus, H.S. Matis, M. Oldenburg, F. Retiere, H.G. Ritter, H. H. Wieman, E. Yamamoto, "Novel Integrated CMOS Sensor Circuits," IEEE Transactions on Nuclear Science, vol. 51, No. 5, Oct. 2004, pp. 2328-2336.

S. Kleinfelder, F. Bieser, Y. Chen, R. Gareus, H.S. Matis, M. Oldenburg, F. Retiere, H.G. Ritter, H.H. Wieman, E. Yamamoto, "Novel Integrated CMOS Pixel Structures for Vertex Detectors," Nuclear Science Symposium, 2003, Conference Record of the 2003 IEEE, 2003, pp. 335-339.

H.S. Matis, F. Biester, S. Kleinfelder, G. Rai, F. Retiere, H.G. Ritter, K. Singh, S.E. Wurzell, H. Wieman, E. Yamamoto, "A CMOS Active Pixel Sensor for Charged Particle Detection," Nuclear Science Symposium, 2002. Conference Record of the 2002 IEEE 1, 2002, pp. 259-263.

N.H. Xuong et al., "First Use of a High Sensitivity Active Pixel Sensor Array as a Detector for Electron Microscopy," Proc. SPIE 5301, 2004, pp. 242-249.

A.R. Faruqi, "Prospects for Hybrid Pixel Detectors in Electron Microscopy", *Nuclear Instruments and Methods in Physics Research A*, vol. A466, 2001, pp. 146-154.

Z. Czyzewski, D.O. Maccallum, A Romig, D.C. Joy, "Calculations of Mott Scattering Cross Section," *Journal of Applied Physics*, vol. 68, No. 1, Oct. 1, 1990, pp. 3066-3072.

H. Bichsel, "Inelastic Electronic Collision Cross Sections for Monte Carlo Calculations", Nuclear Instruments & Methods in Physics Research Section B, Beam Interactions with Materials and Atoms, vol. 52, 1990, pp. 136-139.

R. Lata et al, "Maturation Dynamics of a Viral Capsid: Visualization of Transitional Intermediate States", *Cell*, vol. 100, Jan. 21, 2000, pp. 253-263.

J. Frank, "The Ribosome—a Macromolecular Machine par Excellence", *Chemistry & Biology*, vol. 7, 2000, pp. R133-R141.

Davies, C. & S.W. White, "Electrons and x-rays gang up on the ribosome", *Structure*, vol. 8, 2000, pp. R41-R45.

Baker, T.S., and Johnson, J.E., "Low resolution meets high: towards a resolution continuum from cells to atoms", Curr. Opin. Struct. Biol. 6: (1996), pp. 585-594.

E.H.M. Heijne, "Semiconductor Micropattern Pixel Detectors: A Review of the Beginnings," *Nuclear Instruments & Methods in Physics Research, Section A.*, vol. A465, 2001, pp. 1-26.

H.S. Matis et al., "A CMOS Active Pixel Sensor for Charged Particle Detection," *Nuclear Sci. Symposium*, Conference Record of the 2002 IEEE, 2002, pp. 259-263.

G. Claus et al., "Monolithic Active Pixel Sensors for a Linear Collider," *Nuclear Instruments & Methods in Physics Research, Section A*, vol. A473, 2001, pp. 83-85.

A.R. Faruqi, R. Henderson, S. Subramaniam, "Cooled CCD Detector with Tapered Fibre Optics for Recording Electron Diffraction Patterns", *Ultramicroscopy*, vol. 75, 1999, pp. 235-250.

E. Fossum, "Active Pixel Sensors: Are CCD's Dinosaur?", Proceeding SPIE 1900, 1993, pp. 2-14.

K.H. Downing and D.A. Granio, "Analysis of Photographic Emissions for Electron Microscopy of Two-Dimensional Crystalline Specimens", *Ultramicroscopy*, vol. 7, 1982, pp. 381-404.

G.Y. Fan, M.H. Ellisman, "Digital Imaging in Transmission Electron Microscopy", *Journal of Microscop*, vol. 199, No. 1, Oct. 2000, pp. 1-13.

CCLRC Centre for Instrumentation, http://www.efi.circ.ac.uk/reports/CFIB-p05-03.pdf, Jun. 2003.

Horacek, M., "Direct Detection of Electrons by Area Aray CCD", www.isibmo.cz/~mih/clanky/RadioBmo1999.pfd, 1999.

Finkelstein, H., Ginosar, R., "Front-side-bonbarded metal-plated CMOS electron sensors", SPIE vol. 3301, Apr. 1998, pp. 186-197.

Roberts, P.T.E. et al., "A CCD-based image recording system for the CTEM", Ultramicroscopy 8, 1982, pp. 385-396.

Faruqi, A.R., Cattermole, D.M., "Digital Detectors for Electron Microscopy," Nuclear Instruments and Methods, Feb. 2001, pp. 1-14.

\* cited by examiner

DIRECT COLLECTION TRANSMISSION ELECTRON MICROSCOPY

PRIORITY CLAIM AND REFERENCE TO RELATED APPLICATION

This application is related to and claims priority under 35 U.S.C. §119 from prior provisional application 60/634,408, which was filed on Dec. 8, 2004.

FIELD OF THE INVENTION

A field of the invention is transmission electron microscopy.

BACKGROUND

Transmission electron microscopy conducted conventionally involves the use of film, video cameras or CCD (charge coupled device) detectors to detect high energy charged particles directly or indirectly through the agency of a intervening electron-sensitive scintillator screen which allows information to be collected on photon sensitive devices. Existing detection techniques have drawbacks.

Transmission electron microscopy has many applications. One important application is to the analysis of protein structure. Protein crystallography is the premier method to determine the 3D structures of large proteins, DNA or RNA/protein complexes, and viruses.

Cryo-Electron Microscopy ("cryo-EM") could be used as a substitute technique for protein crystallography. An advantage of cryo-EM over protein crystallography is that it does not depend on growing large crystals, a very time consuming and, in many cases, impossible task. The main drawback, however, is the low resolution of the structures obtainable with conventional technology. For virus analysis, resolutions of about 7.4 Å have been achieved, and for large protein complexes, e.g., ribosome, resolutions of about 11.5 Å have been achieved. Despite these resolution limitations, cryo-EM has been employed successfully in time-resolved experiments to reveal the dynamic aspects of protein interaction.

Two principle factors limit the resolution of the structures characterized with cryo-EM. The first is difficulties with specimen stabilization and radiation damage. The second are difficulties with the collection and processing of the very large data sets required for statistical analysis. The problems with specimen stabilization and radiation damage have been largely corrected with electron microscopes that feature exceptional coherence and stability, and low temperature stages, and that hold specimens at either liquid nitrogen or liquid helium temperatures. Features have been developed that essentially remove chromatic aberration, for example.

The use of film to record images is problematic. While film provides excellent modulation transfer functions, especially in comparison with commercial CCD cameras, it requires several post-acquisition steps, including development and digitization, that are cumbersome and time-consuming. Even prior to the post acquisition, the use of film is cumbersome. The loading and unloading of film into a typical transmission electron microscope is a time-consuming procedure, and if the particular procedures are not followed exactly for a given microscope then the exposed film can be ruined or the unexposed film can be loaded improperly.

It has been estimated that to get a 10 Å (Angstrom) resolution structure of a large protein complex like the ribosome, it would be necessary to collect 100,000 images. We estimate that 3 Å resolution of a structure would require up to one million images with film. This renders present film detection techniques highly impractical, at the least.

CCD device detectors are also used for data detection in transmission electron microscopy. Commonly available CCD detectors for transmission electron microscopy have formats up to 4000×4000 pixels, although few, if any, commercial detectors deliver the full resolution of the device. The CCD detectors require the use of a phosphorescent scintillation screen to convert the electron image to a photonic image within a spectral range where the detector quantum efficiency is maximized. Unfortunately, with each electron event, a spot created within the scintillation screen is greater that the pixel pitch of the device. At 300 KeV, the full width at half maximum of the spot is around 30 µm; however, the full width at 1% is 200 µm. With a CCD pixel size of 15 µm×15 µm, the large spot size will effectively reduce a 2000×2000 pixel CCD to only 1000×1000 and a 4000×4000 pixel CCD to 2000×2000. To mitigate this problem, tapered fiber optics and/or demagnification lens optics can be used. However, large spatial distortions and non-uniformities, which are difficult to correct, are introduced by such optics. With demagnification lens-optics, the poor efficiency of the coupling dramatically reduces the number of photons reaching the CCD. CCD cameras for transmission electron microscopy can costs tens or hundreds of thousands of dollars.

SUMMARY OF THE INVENTION

In the invention, transmission electron microscopy is conducted with direct detection. An active pixel detector detects the incident signal, and provides a fast readout. Direct digital readout facilitates data collection and storage. The data collection and storage can be fully automated.

A preferred method for transmission electron microscopy includes a step of generating a microscopy signal. The microscopy signal is then detected with an active pixel detector that includes a plurality of pixels. Each of the pixels includes at least one photodiode. Each pixel integrates an incident signal over a collection time period. In a preferred embodiment, the read out time permits there to be a single electron event recorded per pixel, indicating either a single electron or the lack thereof. This permits simple accumulation of the pixel counts for each pixel in read-out and storage electronics.

A preferred embodiment active pixel detector of the invention has a plurality of pixels. Each pixel includes one or more photodiodes formed by a p-n junction to collect electrons generated by an incident high energy electron in its passage through a epitaxial layer into which the p-n junction is formed. Each pixel integrates the collected electrons during an exposure period. At the conclusion of the exposure period, the contents of the active pixel detector array can be read out, digitized and stored. In preferred embodiments, integration and read out electronics are implemented near the top surface of a chip, and are transparent to the incident electrons.

DETAILED DESCRIPTION OF THE PREFERRED EMBODIMENTS

Figure 1:
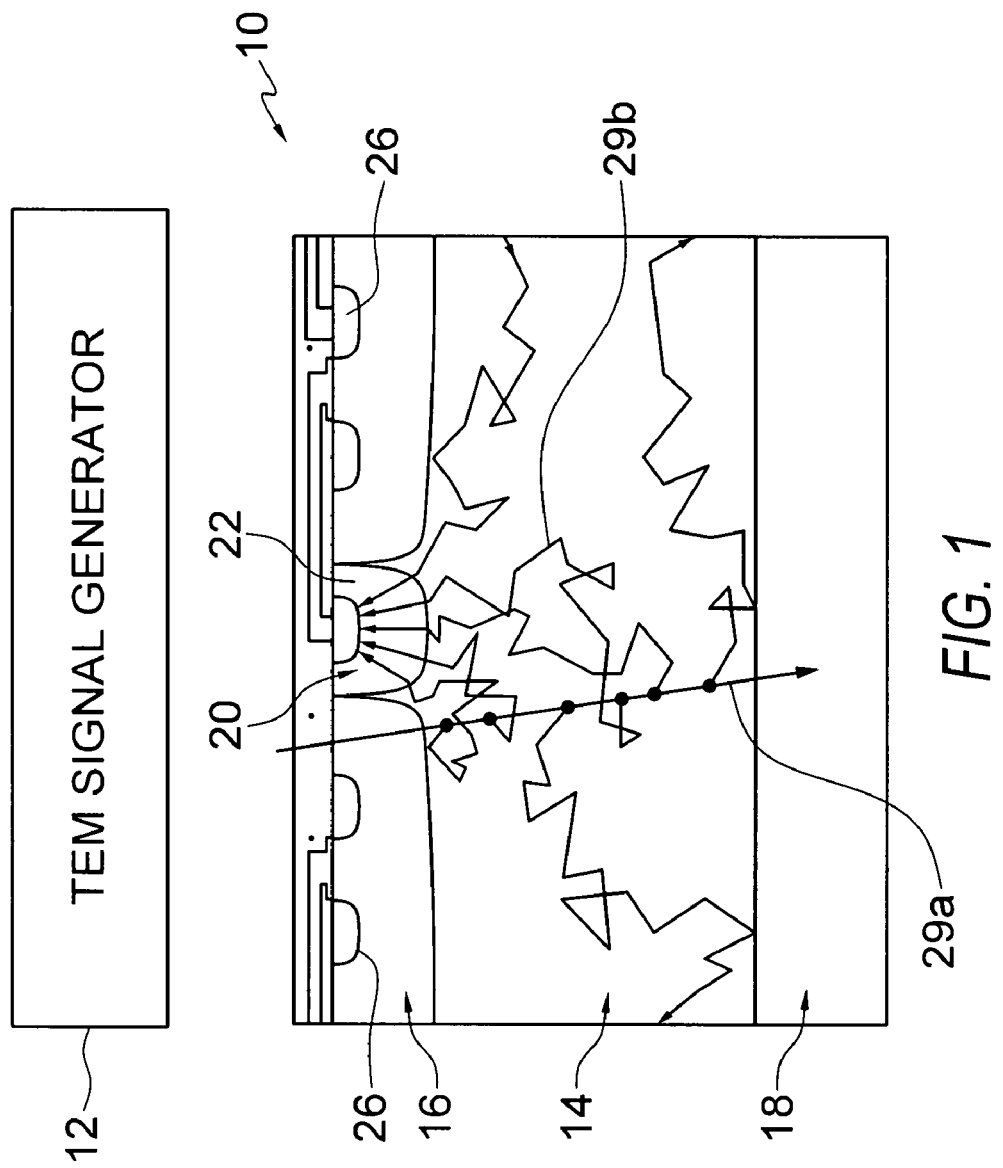
FIG. 1 is a schematic cross-section view of a pixel of an active pixel detector according to an embodiment of the invention.

Embodiments of the invention provide a detector for transmission electron microscopy. Direct detection is achieved without film or a scintillation screen. A preferred embodiment active pixel detector of the invention has a plurality of pixels. Each pixel includes one or more photodiodes formed by a p-n junction to collect electrons generated by an incident high energy electron in its passage through an epitaxial layer into which the p-n junction is formed. Each pixel integrates the collected electrons during an exposure period. At the conclusion of the exposure period, the contents of the active pixel detector array can be read out, digitized and stored. In preferred embodiments, integration and read out electronics are implemented near the top surface of a chip, and are transparent to the incident electrons.

In a preferred embodiment, the epitaxial layer is formed on a substrate that is thin enough to limit or eliminate signals caused by backscattering of electrons from the substrate. In a preferred embodiment, the substrate is less than about 30 µm thick. Preferred embodiment active pixel detectors have fast read out capabilities, provide small pitch between pixels, and provide large formats, e.g., a 3500×4000, 8,000×8,000 or larger pixel active pixel detectors having a 5 µm×5 µm or smaller pixel pitch. With use of massively parallel on chip analog to digital conversion, fast readout can be achieved with many frames per second. The size of the array is limited primarily by the ability to conduct a read out in the desired time, which may change depending upon the application and may also change as advances in read-out circuitry and semi-conductor fabrication techniques continue. Preferred embodiment devices provide an excellent signal to noise ratio, e.g. providing detection of single electron events at a signal to noise ration of 10:1. Preferred embodiment active pixel detector devices also provide excellent spatial resolution, e.g., ~2.55 µm, full width at half maximum. In preferred embodiments, a fast readout is conducted with a readout frame being taken at least every ~100 ms. In a preferred embodiment, fast readout is conducted such that each pixel will collect the charge from either one or no electrons. Readout electronics then maintain a simple counter for each pixel making the data acquisition and analysis very straightforward.

In additional preferred embodiments, cooling is added to cool the active pixel detector in the electron microscope. The cooling of the active pixel detector reduces a dose effect that occurs over time. Preferably, the active pixel detector is cooled to ~−20° C. or less to avoid creation of large dark current noise over time. Alternatively or additionally, if dark current noise becomes a factor during operation, annealing can be used, e.g., at 100° C. to recover the detector.

Additionally, techniques used to protect CCD detectors from a high doses can be used in a microscope incorporating an active pixel detector of the invention. For example, to avoid x-rays that travel down the middle of the microscope column can be diverted from the active pixel detector. The detector can be shifted slight off-axis, with lenses or deflectors being used to shift the electron image to the detector.

Some preferred embodiment electron microscopes and methods for microscopy use an active pixel detector that has been previously used for particle physics experiments, but has not, to the knowledge of the inventors been used for transmission electron microscopy. Details of active pixel detectors that have been used for particle physics experiments and that are suitable for use in embodiments of the invention can be found in a number of publications, including the following publications. See, R. Turchetta et al. "A monolithic active pixel sensor for charge particle tracking and imaging using standard VLSI CMOS technology", N.I.M. in Physics Res. A458, 677–689 (2001); G. Claus et al., "Particle tracking using CMOS monolithic active pixel sensor", N.I.M. in Physics Res., A465, 120–129 (2001); S. Kleinfelder, H. Wieman, E. Yamamoto et al. "Integrated X-ray and charged particle active pixel CMOS sensor arrays using an epitaxial silicon sensitive region", Proc. of the SPIE Hard X-ray and Gamma Ray detector, Physics IV, July 2002; H. S. Matis, S. Kleinfelder, H. Wieman et al. "A CMOS Active Pixel Sensor for charged particle detection", Nuclear Sci. Symposium, Conference Record of the 2002 IEEE. As has already been mentioned, additional preferred embodiments of the invention have a similar, but modified structure. Particularly, the substrate is thinned to reduce noise caused by re-entry of electrons into the epitaxial layer.

Preferred embodiments of the invention will now be illustrated with respect to the drawings. In the drawings, schematic illustrations and cross-sections will be fully understood by artisans. Some laboratory prototype devices will also be discussed. Artisans will appreciate that commercial fabrication processes can produce optimized devices consistent with the invention, and that devices of the invention can be part of a large scale integrated circuit. Many additional advantages, features and embodiments of the invention will be apparent from the above discussed and following embodiments.

Referring now to FIG. 1, a preferred embodiment active pixel detector 10 of the invention is shown. A single pixel is shown in FIG. 1, but artisans will readily appreciate its replication into columns and rows to form an array. The detector 10 is disposed with respect to a transmission electron microscope electron signal generator 12, namely, a source of high energy electrons. The detector 10 includes a sensitive epitaxial layer 14, e.g., a p⁻ epitaxial layer. The epitaxial layer 14 is disposed between a well layer 16 and a substrate 18, e.g. a p-well layer 16 and a p⁺⁺ substrate 18.

In a preferred embodiment, the substrate that 18 is thin enough to limit or eliminate signals caused by backscattering of electrons from the substrate. In a preferred embodiment, the substrate 18 is less than about 30 μm thick. In an additional preferred embodiment, the substrate 18 is less than about 20 μm thick.

FIG. 1 shows a single pixel 20, but artisans will appreciate that a device can include a large scale integration including many pixels. Inside each pixel are one or more photodiodes 22 formed by an n-p junction, which is realized in FIG. 1 by the interface of an n⁺ diffusion region and the p⁻ epitaxial region 14 that will collect ionization electrons generated by an incident high energy electron(s) in its passage through the p⁻ epitaxial layer 14. Read out electronics 26 are integrated with the detector 10 and can be formed of materials that are transparent to the high energy incident electrons generated by the high energy electron signal generator 12. The read out electronics periodically integrate each pixel 20, and each pixel integrates an incident signal, namely the electrons that it collects in response to the incident high energy electrons over the collection time period between the period read-outs. As seen in FIG. 1, the trajectory 29a of a high energy electron particle generates ionization electrons in the epitaxial layer 14. These ionization electrons migrate toward and are collected by the well 16 along paths 29b. The resultant charge from each pixel 20 is periodically collected.

The epitaxial layer 14 is preferably continuous in an array including a plurality of pixels, permitting a 100% "fill factor", i.e., the proportion of each pixel area that is sensitive to the incident electrons, is 100% due to the fact that the sensitive p⁻ epitaxial layer 14 lies beneath the readout circuitry and is continuous.

A detector of the invention, such as that shown in FIG. 1 can be constructed to have, for example, 4,000×4000 pixels. Other exemplary formats include 1,000×1000 pixel, 500×500, and 250×250 pixel devices. The active pixel detector can be placed in the traditional position for CCD cameras used in transmission electron microscopes.

Figure 2:
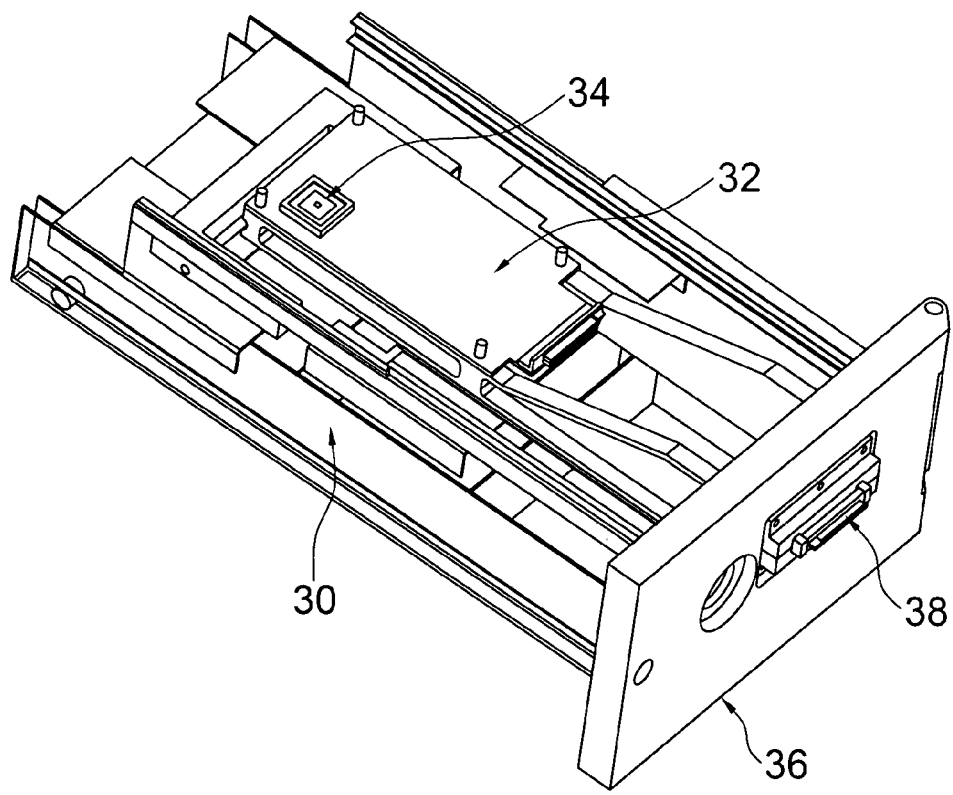
FIG. 2 is a schematic perspective view of an active pixel detector array assembly for a transmission electron microscope according to an embodiment of the invention.

Additionally, an embodiment of the invention, shown in FIG. 2, permits a detector of the invention to be fitted into a transmission electron microscope as a replacement for a film drawer. With reference to FIG. 2, a film tray assembly 30 is configured to be accepted into a transmission electron microscope. The dimensions, structure, and mounting portions of the film tray assembly 30 will depend upon the particular transmission electron microscope. Instead of supporting one or more films or film cartridges, the film tray assembly supports an I/O board 32 including an active pixel detector array 34 of the invention. A door 36 is configured to seal properly to the microscope, and an external connector 38 permits connection to the I/O board 32, for example through a bus connector (not shown in FIG. 2) to a connector 39 on the I/O board 32.

Embodiments of the invention are generally applicable to transmission electron microscopy. For cryo-EM, an incident electron of 200 or 300 keV will generate about 1000 electrons in the epitaxial layer 14. This is significantly higher than the noise, which typically less than 45 electrons. These generated electrons are confined in the epitaxial region until they diffuse toward one or more photodiodes, where they are collected. Each pixel integrates the collected electrons during an exposure period. At the conclusion of the frame, the contents of the active pixel detector array are then read out, digitized and stored.

Experimental prototype active pixel detector devices consistent with FIGS. 1 and 2 have en constructed and tested. While the invention is not limited to the experimental prototype devices, the devices will now be discussed as further aspects of the invention and features of preferred embodiments will be apparent to artisans from the following discussion of the prototypes and testing. Additional embodiments will also be discussed and related to the experimental devices.

In an experiment, a prototype active pixel detector had a p⁻ epitaxial layer that was ~8 to ~10 μm thick. Each pixel in the prototype device integrates the collected electrons during an exposure period. At the conclusion of the frame, the contents of the active pixel detector array are then read out, digitized and stored. All of the integration and read out electronics were implemented near the top surface of a chip fabricated using a 0.25 μm CMOS process, and are transparent to the incident electrons. The "fill factor", i.e., the proportion of each pixel area that is sensitive to the incident electrons, is 100% due to the fact that the sensitive p⁻ epitaxial layer lies beneath the readout circuitry and is continuous.

The prototype active pixel detector was a 128×128 pixel chip having a pixel pitch of 20×20 μm and organized into 4 different quadrants of 64×64 pixels, of which one quadrant, with 4 small (1 μm×1 μm) photodiodes per pixel, was of particular interest. The chip was designed in a standard TSMC digital 0.25 μm CMOS process that includes an 8–10 μm epitaxial layer. The analog output of the active pixel detector was digitized at 0.4 MHz to 16 bits. The exposure time of each frame was the time it took to read out two quadrants, about 20 msec. A correlated double sampling method was used to reduce reset noise by subtracting subsequent frames. As the chip was not reset between reads, the difference is simply the integrated charge in the photodiode during the last frame and reset noise is substantially reduced. All data were taken at room temperature.

The detector chip was mounted in a JEOL TEM modified film cassette constructed according to FIG. 2, making it easy to mount to any JEOL electron microscope. The electron beam was focused down to about 0.1 mm diameter and aimed at the center of the quadrant to be studied. The goal was to measure the signal to noise ratio and the spatial resolution of the detector at incident electron energies of 200, 300, and 400 keV.

Figure 3:
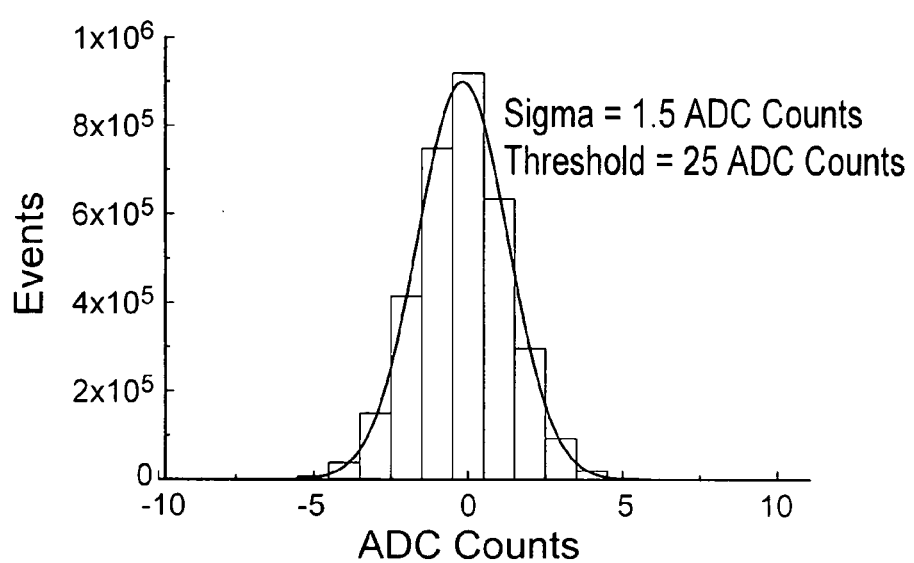
FIG. 3 is a histogram of reading of all pixels in a thousand frames collected from an experimental prototype active pixel detector array having a pixel pitch of 20×20 µm and organized into 4 different quadrants of 64×64 pixels, of which one quadrant, had 4 small (1 µm×1 µm) photodiodes per pixel.

At first, a thousand frames were collected without any incident beam. A histogram of the reading of all pixels in these frames yields an average noise sigma of 1.5 of the Analog to Digital Converter (ADC) units, as shown in FIG. 3. It was also observed that there are very few (less than 0.1%) readings equal to or above 25 ADC units. Therefore, a noise floor value of 25 ADC units was used as the threshold value of the detection of an incident electron or x-ray. Other experiments had shown that the quadrant with 4 small photodiodes per pixel has very good charge collection efficiency with 100% of the deposited charge collected within a 3×3 pixel area. For experiments discussed in detail in this application, an electron (or x-ray) event was defined as a cluster of connecting pixels with the maximum read out at or above 25 ADC units. The energy deposition of this hit is proportional to the sum of ADC values in the area of 3×3 pixels centered on the maximum pixel with the maximum read-out.

Figure 4:
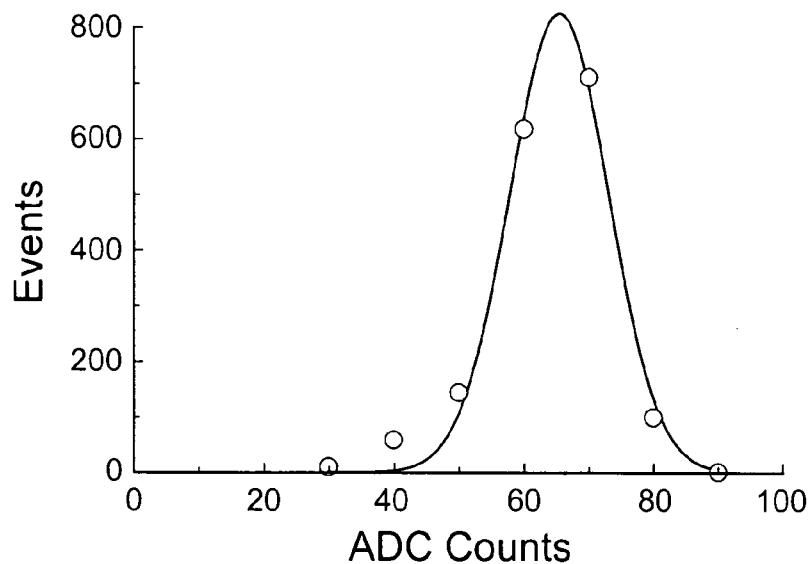
FIG. 4 is a histogram distribution of energy deposited by Fe55 x-rays in the experimental prototype 128×128 pixel chip having a pixel pitch of 20 x×20 µm and organized into 4 different quadrants of 64×64 pixels, of which one quadrant, had 4 small (1 µm×1 µm) photodiodes per pixel.

To convert the energy deposited in the detector from the pixel ADC values, with the detector was illuminated with a 5.9 keV x-rays from a $Fe^{55}$ source. FIG. 4 shows the histogram distribution of the energy deposited by $Fe^{55}$ x-rays. This histogram fits a Gaussian distribution very well with a mean at 65.9 ADC units, therefore yielding a relation of 11.1 ADC units per keV of energy deposited by a particle inside the detector. The extra events in the lower end tail in FIG. 4 could be due to readout noise.

Figure 5A:
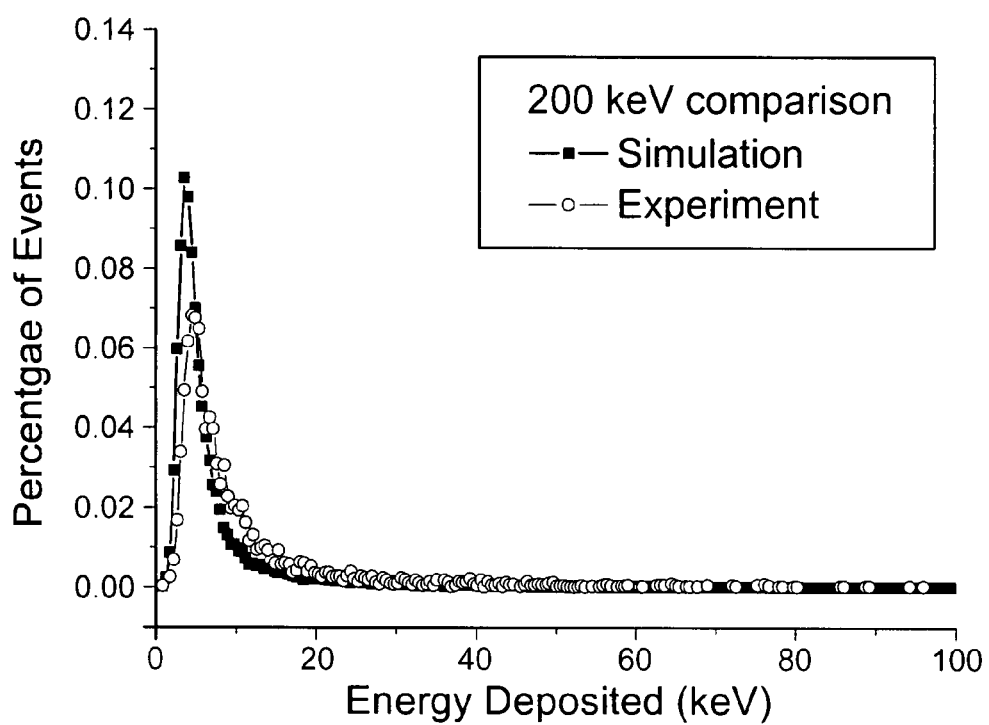
FIGS. 5A–5C respectively show the histogram of the energies deposited in the active pixel detector by incident electrons of 200, 300, or 400 keV in the experimental prototype 128×128 pixel chip having a pixel pitch of 20×20 µm and organized into 4 different quadrants of 64×64 pixels, of which one quadrant, had 4 small (1 µm×1 µm) photodiodes per pixel.
Figure 5B:
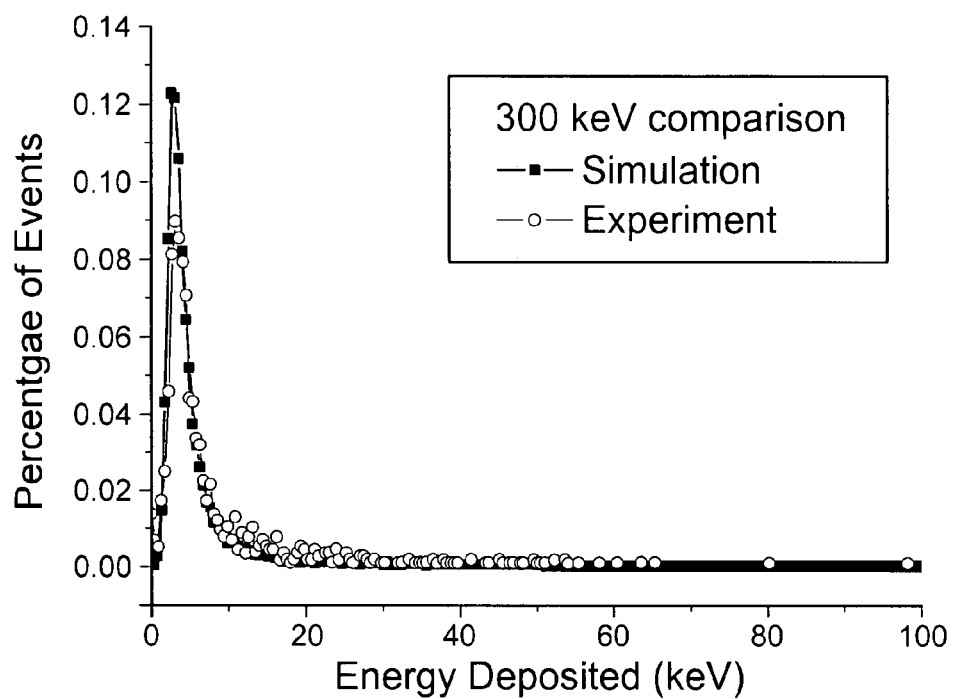
Figure 5C:
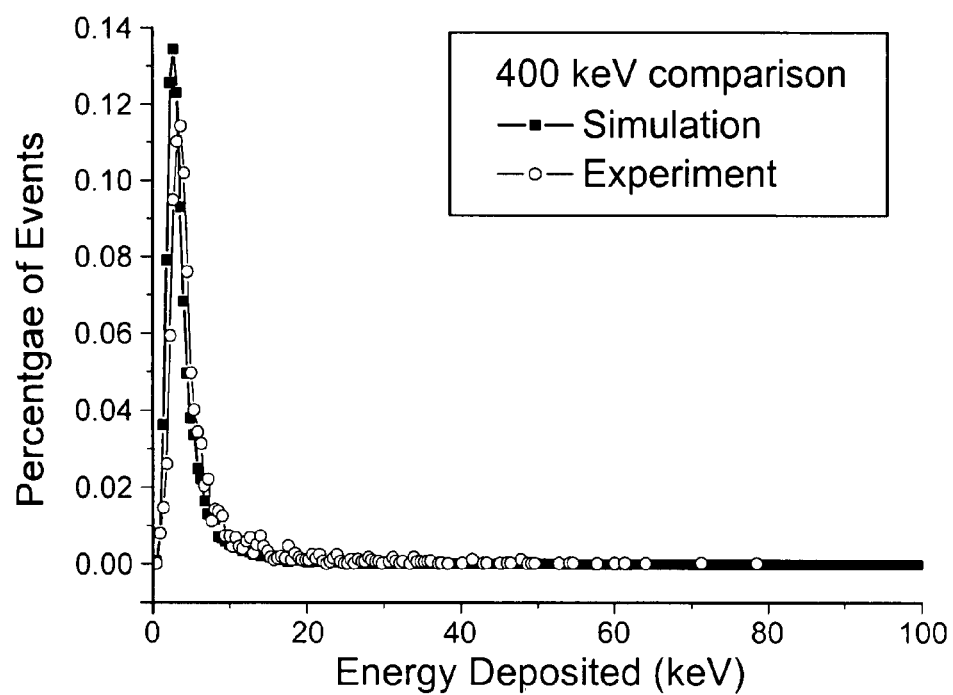

FIGS. 5A-5C respectively show the histogram of the energies deposited in the active pixel detector by incident electrons of 200, 300, or 400 keV where about 2300, 1800, and 2000 were the number of events counted, respectively. As expected, we see in each histogram a Landau distribution below 10 keV with a peak around 4-6 keV. However, many events have unexpectedly higher absorbed energy values. These events are very probably not from x-rays generated inside the EM, since the thin (8-10 μm) epitaxial layer of the detector has very low efficiency to detect the x-rays, specifically the ones above 20 keV. It was determined that these events are caused by incident electrons that are backscattered in the silicon substrate, which was ~250 μm thick in the experiments. The backscattered electrons and re-enter the sensitive epitaxial layer a second time with much lower velocity and therefore deposit more energy into the detector. This conclusion is supported by extensive simulation experiments where it was found that at incident electron energies between 200 and 400 keV, an average of 1 out of 10 incident electrons will go through this backscattering process and re-enter the sensitive epitaxial layer a second time. Simulations show the extra energy deposited by backscattering events decrease to less than 1% for incident electrons of 300 keV when the silicon substrate can be thinned down to 30 μm or less. Preferably, substrate is thinned to ~30 μm, or less. A back-thinning material removal process can be conducted subsequently to the formation of pixels and CMOS electronics.

To experimentally confirm the beneficial effect of the thinned substrate, typical events generated by a single incident electron where the energy deposited was less than 10 keV were considered. Original data were obtained with an active pixel detector chip with a standard silicon substrate thickness (~300 μm). The data shown in Table 1 below has been adjusted to account for the thinning of the substrate to about 30 μm by excluding events where the energy deposited was greater than 10 keV

TABLE 1

|  | $Y_1$ | $Y_2$ | $Y_3$ | $Y_4$ | $Y_5$ | $Y_6$ | $Y_7$ |
|---|---|---|---|---|---|---|---|
| $X_1$ | 4 | 0 | 0 | 4 | -2 | 3 | 1 |
| $X_2$ | 0 | 0 | 1 | 1 | -1 | 0 | 2 |
| $X_3$ | -2 | 0 | 0 | 7 | 1 | 1 | 1 |
| $X_4$ | 0 | -3 | 4 | 24 | 2 | -1 | 0 |
| $X_5$ | -1 | 1 | -1 | 2 | 2 | 2 | 1 |
| $X_6$ | -2 | 0 | 1 | 0 | -2 | 3 | -2 |
| $X_7$ | -1 | -3 | 2 | -2 | 3 | 1 | -3 |

Table 1 shows a typical reading for such an incident electron at 300 keV. In these clusters, the significant pixel values are always grouped inside a 3×3 array centered on the pixel with the maximum value. In order to get the average reading distribution, a 7×7 (X×Y) array centered on the pixel with maximum reading was selected. The pixel value at each pixel position was added to the sum of all values of the pixel in equivalent positions in previous cases. At the end of a run, this sum was divided by the number of cases i.e. the number of detected electrons. Table 2 shows this average distribution for 300 keV incident electrons.

TABLE 2

|  | $Y_1$ | $Y_2$ | $Y_3$ | $Y_4$ | $Y_5$ | $Y_6$ | $Y_7$ |
|---|---|---|---|---|---|---|---|
| $X_1$ | 0 | 0 | 0 | 0 | 0 | 0 | 0 |
| $X_2$ | 0 | 0 | 0 | 0 | 0 | 0 | 0 |
| $X_3$ | 0 | 0 | 0 | 3 | 0 | 0 | 0 |
| $X_4$ | 0 | 0 | 3 | 31 | 3 | 0 | 0 |
| $X_5$ | 0 | 0 | 0 | 3 | 0 | 0 | 0 |
| $X_6$ | 0 | 0 | 0 | 0 | 0 | 0 | 0 |
| $X_7$ | 0 | 0 | 0 | 0 | 0 | 0 | 0 |

The average distribution has significant values only inside a 3×3 array centered on the maximum. By summing over the 3×3 array, the average read out value of 43 ADC units is obtained. Since the average noise is about $\sqrt{9}\times 1.5 = 4.5$ ADC units, one can see that the average signal-to-noise ratio of each detected electron is approximately 10:1.

This detector also has a good spatial resolution. The projection of the average distribution represented in Table 2 on either the X or Y coordinate could be fitted to a Gaussian curve with a FWHM of 21 μm. This FWHM is due mostly to the fact that the incident electrons are distributed all over the central pixel. If the distribution is supposed to be Gaussian with a FWHM of 20 μm (the size of a pixel) an attempt to de-convolute the result can be made and a spatial resolution of about 7 μm ($\approx \sqrt{(21)^2-(20)^2}$) is obtained. Using this same method, data yielded a signal-to-noise ratio of about 10:1 and a spatial resolution of about 11 μm for both 200 and 400 keV beams.

The results show that it is possible to use an active pixel detector array of the invention to build a detector for cryo-EM with incident electron energy in the range of 200-400 keV, having a signal to noise ratio of about 10:1 and with a spatial resolution of about 10 μm FWHM.

A 0.25 μm CMOS process can be used to reduce pixel size to 5 μm×5 μm and to produce, e.g., a 4000×4000 pixel detector. A preferred embodiment device is a 3500×4000 active pixel detector. By thinning the substrate down to 30 μm or less, almost all the backscattering events can be eliminated.

In additional experiments, a 512×550 active pixel detector chip of the invention with a 5 μm was designed in a standard TSMC digital 0.25 micron CMOS process that includes an 8 micron epitaxial layer. Correlated double sampling was used to reduce reset noise by subtracting subsequent frames. As the chip was not reset between reads, the difference is simply the integrated charge in the photodiode during the last frame and reset noise is substantially reduced. The exposure time (set by computer) can be as small as the read out time (50 ms) or as long as a few seconds. All data were taken at room temperature. For the experiment results discussed herein, the total exposure time of each frame was about 90 ms. 4 parallel analog outputs with 4 parallel (12 bits) ADC sampling at 1.25 MHz was used for fast read-out.

Figure 6:
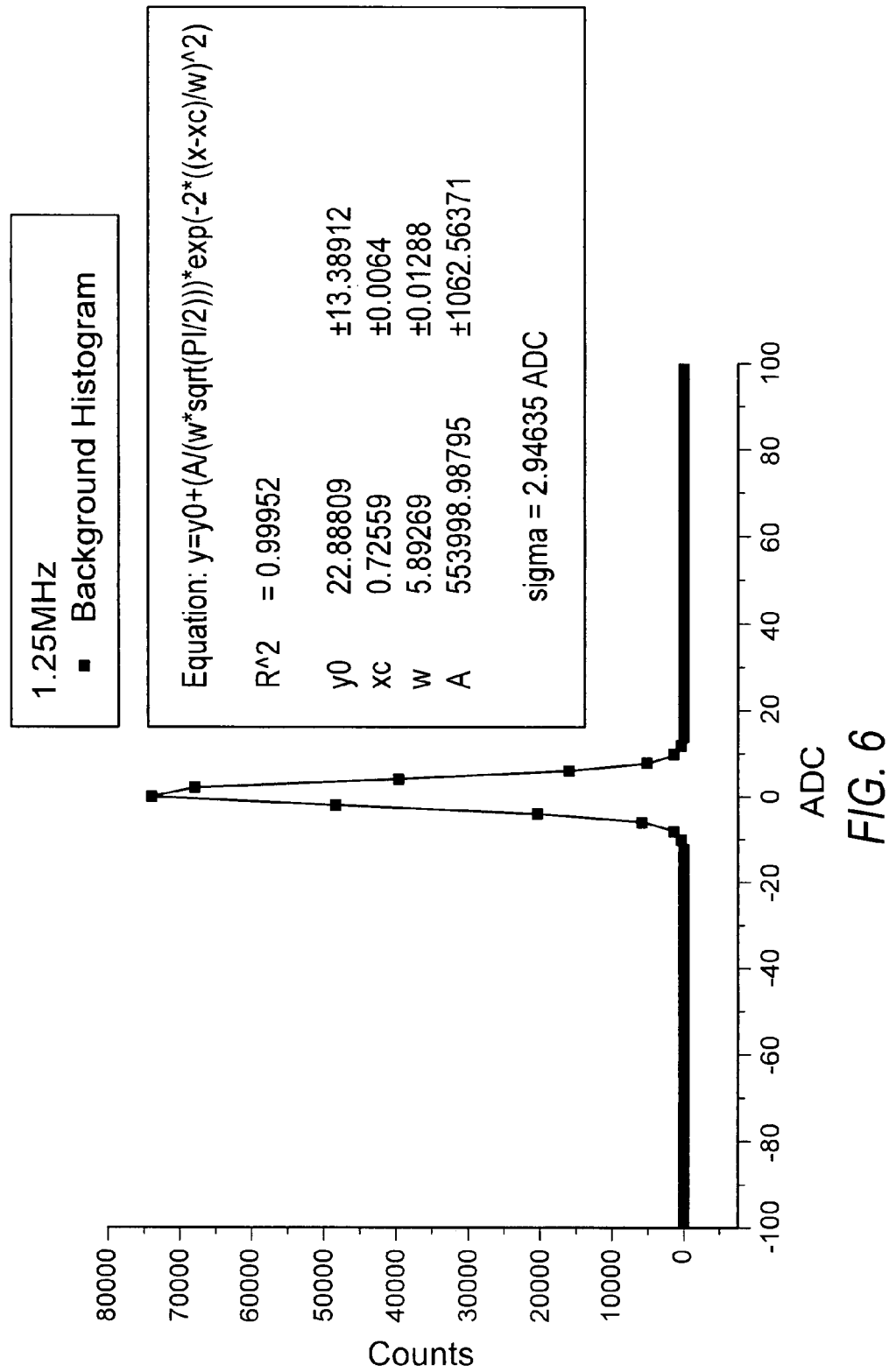
FIG. 6 shows histogram of the reading of all pixels in 1000 frames taken without an incident electron beam to test the background noise level of an experimental prototype 512×550 active pixel detector array of the invention fabricated designed in a standard TSMC digital 0.25 micron CMOS process that includes an 8 micron epitaxial layer.

An experimental goal was to measure the signal to noise ratio and the spatial resolution of the experimental active pixel detector at an incident electron energy of 200 keV. At first, 1000 frames were collected without any incident beam. A histogram of the reading of all pixels in these frames yields an average noise sigma of 3.0 ADC units, as seen in FIG. 6. Also, there are very few (less than 0.1%) readings equal to or above 40 ADC units. Therefore, a noise floor value of 40 ADC units was used as the threshold value of the detection of an incident electron.

Next, the electron beam was turned on. It was reduced so that in each frame, there was only about 1 incident electron.

The top of Table 3 shows the typical reading for 1 incident electron. In these clusters, the significant pixel values are always grouped inside a 5×5 array centered on the pixel with the maximum value. The values of the pixels at the center are quite high with up to a 40 or 50 signal-to-noise ratio. In order to get the average reading distribution, for each case a 7×7 array centered on the pixel with maximum reading was selected. The pixel value at each pixel position was added to the sum of all values of the pixel in equivalent positions in previous cases. At the end of a run, this sum was divided by the number of cases i.e. the number of detected electrons. Table 3 (bottom) shows this average distribution for 200 keV incident electrons.

TABLE 3

Chip with 550 × 512 pixels of 5 μm pitch

|  |  | $Y_1$ | $Y_2$ | $Y_3$ | $Y_4$ | $Y_5$ | $Y_6$ | $Y_7$ |
|---|---|---|---|---|---|---|---|---|
| Typical event generated by a single 200 keV incident electron. | $X_1$ | −3 | 4 | 3 | −1 | 0 | 5 | 2 |
|  | $X_2$ | 0 | −1 | 5 | 9 | 3 | −3 | 2 |
|  | $X_3$ | 2 | 1 | 20 | 34 | 12 | 3 | 6 |
|  | $X_4$ | 0 | 4 | 27 | 88 | 6 | 3 | 2 |
|  | $X_5$ | −5 | 3 | 5 | 3 | 3 | −2 | 3 |
|  | $X_6$ | −1 | −2 | −5 | −1 | −1 | −1 | −1 |
|  | $X_7$ | −1 | 0 | 1 | −2 | 1 | 0 | −1 |
|  |  | $Y_1$ | $Y_2$ | $Y_3$ | $Y_4$ | $Y_5$ | $Y_6$ | $Y_7$ |
| Average distribution with 200 keV incident electrons. | $X_1$ | −1 | −1 | −1 | −1 | −1 | −1 | −1 |
|  | $X_2$ | −1 | 0 | 1 | 2 | 1 | 0 | −1 |
|  | $X_3$ | −1 | 1 | 8 | 18 | 8 | 1 | −1 |
|  | $X_4$ | 0 | 2 | 18 | 92 | 18 | 2 | 0 |
|  | $X_5$ | −1 | 1 | 8 | 18 | 8 | 1 | −1 |
|  | $X_6$ | −1 | 0 | 1 | 2 | 1 | 0 | −1 |
|  | $X_7$ | −1 | −1 | −1 | −1 | −1 | −1 | −1 |

Signal to Noise Ratio = 212/(3 * sqrt(25)) = 14:1
Spatial resolution = sqrt($5.5^2 - 5.0^2$) = 2.3 μm The average distribution has significant values only inside a 5×5 array centered on the maximum. By summing over this 5×5 array, an average read out value of 212 ADC units is obtained. Since the average noise is about the [square root of 25]×3=15 ADC units, the average signal-to-noise ratio of each detected electron is about 14/1.

The experimental active pixel detector also exhibited very good spatial resolution. The projection of the average distribution shown in Table 3 (bottom) on either the X or Y coordinate can be fitted to a Gaussian curve with a FWHM of 5.5 micron. This FWHM is due mostly to the fact that the incident electrons are distributed all over the central pixel. If this distribution is supposed to be Gaussian with a FWHM of 5 micron (the size of a pixel) then one can de-convolute the result and obtain a spatial resolution of about 2.3 micron.

In addition to the 200 keV experiments, other levels were also tested. Specifically, it was also verified that the signal-to-noise ratio and the spatial resolution remain as good with 300 keV and 400 keV incident electrons.

The active pixel detector was also used to take a picture of myelin, the insulative wrappings of the rapidly conducting nerve fibers of the nervous system, at a magnification of 2500. A myelin layer is about 10 nm and the transition across the Myelin band in images taken with the experimental active pixel detector of the invention was about 25 micron, i.e., 5 pixels. Details of the myelin membrane layers were clearly visible. The same details were lost on an image of the same myelin sample when taken at the same magnification using a CCD based camera. The loss of details is likely due to the poor spatial resolution of the scintillation screen required to be used with the CCD based camera. The experiments showed that the active pixel detector of the invention can take images at room temperature, and produce excellent results even without any software correction of images.

An exemplary 1K×1K pixel active pixel detector with a 5 micron pitch represents another preferred embodiment. The chip is similar to the exemplary experimental 512×550 chip discussed above. To maintain read out time of 50 ms, the number of parallel analog outputs was increased from 4 to 16. The readout electronics system for the exemplary 1K×1K active pixel detector includes three logical modules: a detector carrier and analog buffers, digital control and A/D converters; and a data recording system.

The detector with its analog output buffers and digital input clocking buffers are located in a microscope vacuum. In addition, a Peltier cooler system is attached which can drive the detector cold, for better noise performance. The detector has 16 analog outputs, each buffered first by a low capacitance op amp, which then drives a differential op amp, guaranteeing a low noise signal reception outside the microscope. The 12 bit ADC can run at 1.25 or 5 MHz.

Two logical cable harnesses can be used to penetrate into the microscope vacuum. One harness is an analog output harness, consisting of the 16 differential signals from the detector. The other is the clocking signals for the detector, consisting of row clock, column clock, and various resets.

Clock generation, A/D control, data packing and output can be performed remotely by a Xilinx FPGA (Field Programmable Gate Array) based system. Detector configuration and readout mode information can be received from a local PC, and then the readout sequence begins. Exemplary configuration parameters can include, for example, reset mode, integration time, frames per exposure sequence, etc. The FPGA packs the incoming A/D data with header information and then streams the required number of frames of data to the recording unit.

Data recording unit can be accomplished, for example, with a commercially available unit from Conduant Corp. It is capable of receiving data at 200 MBytes per second, and has approximately 3 Terabytes of storage.

Active pixel detectors of the invention can be used for many imaging applications. Detectors of the invention can also be applied, for example, to wide-field imaging. For the cryo-EM community, a large number of images of distinct particles are necessary to solve a structure. For conventional electron tomography, researchers are interested in the 3-D structure of large protein complexes and organelles in their cellular context where, many tilted views of a single structure are used to compute its 3-D representation. The active pixel detector of the invention can be used for all of these applications.

Experiments have shown that extremely high-resolution images are obtainable on with an active pixel detector of the invention, e.g. a 2.5 micron full width half maximum electron point spread function. By comparison, a 30 micron FWHM electron point spread function is obtained for a scintillator based CCD imaging device. Thus, an experimental prototype active pixel detector, can provide the same resolution image in an area nearly 36 times smaller than that required for a CCD-scintillator system. Such increased resolution enables a used of a transmission electron microscope to utilize the full resolution of the electron image and acquire images at a much lower magnification. Since electron microscope lenses produce an image larger than the size of the typical viewing screen and the area of an active pixel detector of the invention can be so small, there is a large amount of unused wide-field image data available. With proper utilization of image shift coils in a typical microscope, the image can be moved across an active pixel detector of the invention so that many adjacent images can be collected. By moving the image across the detector and allowing for a small overlap, adjacent images can be aligned quickly and reassembled using cross-correlation techniques. Thus, using an active pixel detector in accordance with example prototypes in a montaging system, for example, can produce 36 times the data in the same area that would normally be imaged by a single image in a CCD-scintillator based system, while still using the central portion of the electron optical elements where distortions are minimal.

An exemplary montage system can be realized through operation of beam blanking circuits in combination with fast addressing of the image shift coils to provide seamless wide-field high-resolution images and tomograms. Wide-field tomograms can be produced, for example, with an active pixel detector of the invention by collecting a 6×6 or larger montage of images at each tilt angle. This can be used to cover the area of a similar format CCD detector at a resolution nearly 6 times better, producing high-resolution tomograms of structures that extend for hundreds of microns.

An exemplary application of particular interest is the acquisition of a high-resolution tomogram of an entire cell like a neuron by stitching together multiple sub volumes to produce a model of the neuron at the level of pre-synaptic vesicles and other associated molecular constituents. Such large scale models can be used for painting proteins and structures accurately in their biological context within the cell. Additionally, such models can be used for accurate simulations of neuro-transmission or other biological processes.

In cryo-EM applications, an active pixel detector of the invention can serve as an ultra-high signal to noise detector for quickly imaging large numbers of single particles at low dose (<5 electrons per Ångstrom$^2$). With careful control of the image shift coils, condenser shift coils, and condenser lenses, many sub-areas can be imaged under low-dose conditions before the mechanical stage is moved. This spot scan method can dramatically decrease the acquisition time associated with waiting for the mechanical stage to stabilize before the next image is collected.

Figure 7:
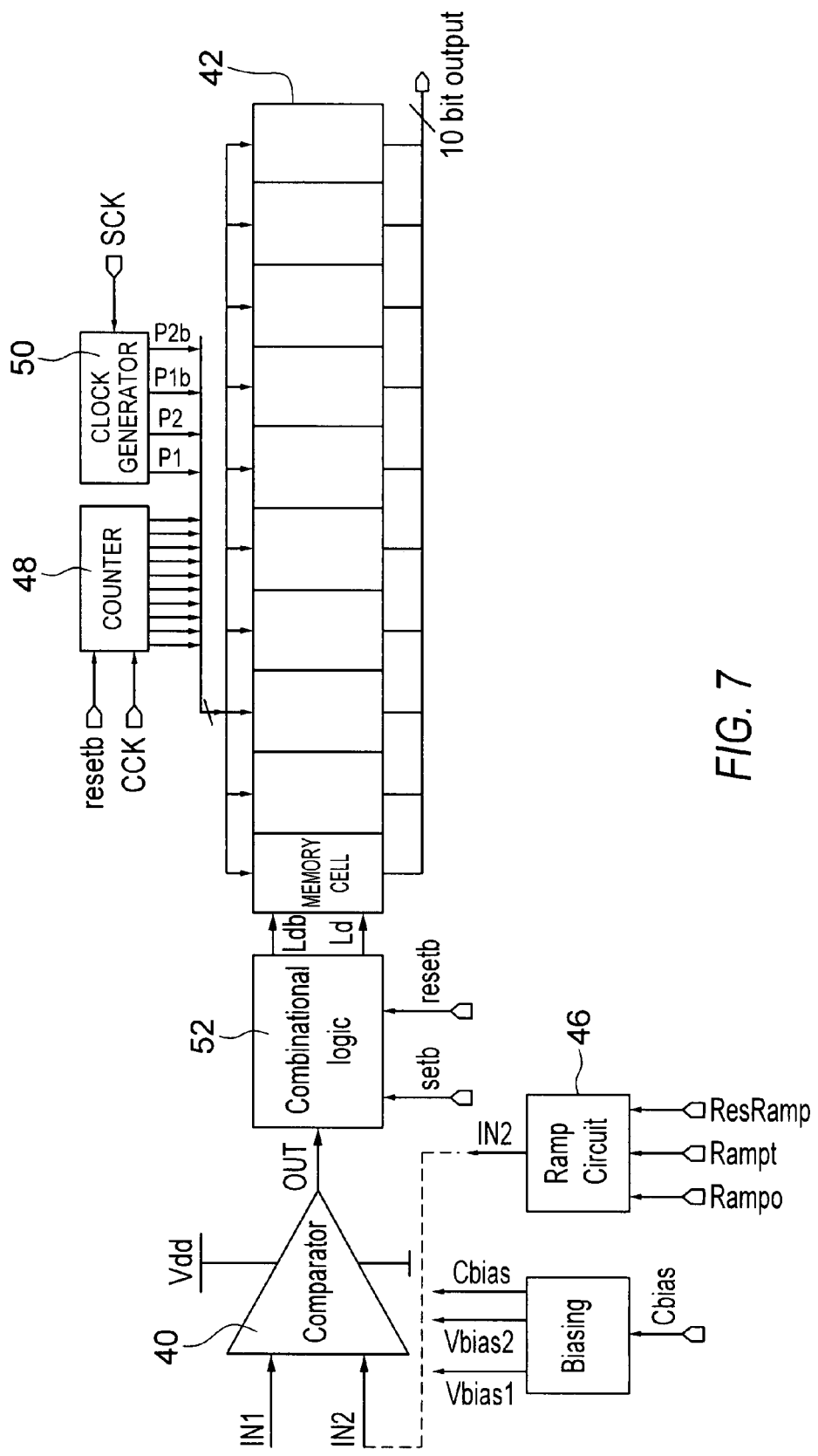
FIG. 7 is a schematic diagram of a single column of a preferred embodiment analog to digital converter for fast readout from a large format active pixel detector array of the invention.

In another preferred embodiment, a highly parallel analog to digital conversion techniques aids fast readout. FIG. 7 schematically illustrates a preferred analog to digital conversion for use with an active pixel detector of the invention, which is especially useful for large format detectors, e.g., 3.5K×4K pixel arrays. A single slope ADC design is well-suited for use with an active pixel detector of the invention due to the compactness and low power consumption of such designs. More generally, preferred analog to digital converters will be compact, lower power, and variable bit depth. FIG. 7 shows an exemplary embodiment ADC for a single column of an active pixel detector. Each column uses a comparator 40 and n-bit digital memory 42. The comparator 40 receives photodiode output as one input and the reference signal from a ramp circuit 46. The value determined by the comparison to reference is shifted into the digital memory 42 under the control of a counter 48 and clock generator 50 from combinational logic 52. Power consumption of only 10 micro-amps or less per column can be achieved with a converter like that shown in FIG. 7.

In addition, the converter of the style of the FIG. 7 analog to digital conversion can provide variable bit-depths and speeds depending on if a high dynamic range but slower frame rate is desired or if fast, lower dynamic range conversions are required. As an estimate for a very large chip of 16 Mpixels, 10 bit conversions and readouts could take place at 12 frames/s, 25 frames/s at 9 bits, 50 frames/s at 8 bits or 100 frames/s at 7 bits. If desired, frames can then be summed to build up increasingly higher-resolution images of nearly any net dynamic range. Use of the double correlation method, which requires 2 readouts per frame, reduces the frame rate by half.

An exemplary embodiment chip with 4,000 parallel analog to digital can read out 12 frame/sec., by using 10 bit precision. For imaging that require large dynamic range, data can be collected, for example, at a speed of 6 frames per second using a double correlation sampling method (with 2 readouts), and then images can be added together digitally. For imaging that requires small dynamic range, an 8 bit range (with the same precision) can be adopted, data can be collected at 25 frame/sec. using double correlation sampling method), and then the images can be added together digitally. These read out techniques with a large format active pixel detector chip are well-suited for CryoEM imaging, since at a reasonable magnification, e.g., 50,000, one could have 1 Å square per pixel and therefore would have, in average, only 5 electron/pixel during a maximum exposure time of 1 second.

Faster read-outs can also be achieved. For example, reading out 16 million pixels at 100 Hz requires 1.6 GHz readout rates. Data can be demultiplexed over a wider bus (e.g., 64 bit bus) to reduce the net data rate to a more manageable 200 MHz.

The advantages with the fast read out are many. First, the dark current in each frame will be reduced. Also with proper fiducials, e.g., gold particles in the sample or image processing techniques such as cross-correlation, it is possible to correct for image drift due to the specimen movement or other instrumental instabilities. The primary difficulty in implementing image correction relates to the reading and storage of the images. As an example, with an active pixel detector of the invention, total exposure time for a virus or particle can be limited to 1 second, an this only requires a memory large enough to store 50 frame readouts (i.e., about 800 MB) in the online computer which then would have plenty of time to store the data on a disk before collecting another set of data. Readout and storage times can be improved with better memory, for example a "Conduant" disk system (4 terabytes with 200 MB/sec speed) can be used to reduce read out and storage times.

Embodiments of the invention include techniques to reduce radiation damage to the active pixel detector when being used to detect electron images in a transmission electron microscope. To test radiation damage, an experimental active pixel detector of the invention was subjected to a continuous 300 keV electron beam with an average intensity of 5 electron/pixel/second. This is equivalent in 1 second to the flux that an active pixel detector would receive in 1 Cryo-EM record using a magnification of 50,000 (i.e., 1 Å square per pixel).

Cooling is one way to reduce the dark current, but other dark current reduction techniques can also be used. Without cooling, the active pixel detector is typically subjected to hot temperatures in the microscopic vacuum, about 33° C. The active pixel detector can be cooled, however, to a temperature that reduces the dark current effect. For example, cooling the active pixel detector to −20° C., can reduce the dark current by a factor of 45 ($2^{5.5}$) and therefore keep dark current at a reasonable value, even at a high radiation doses. A dose of 6.5×10$^5$ electron/pixel is equivalent to about 120,000 cryo EM pictures that could yield about 1.2 million particle images, enough to solve a structure at very high resolution, e.g., 3 Å or better. Such a data collection period could last a few weeks, and is necessary.

Figure 8:
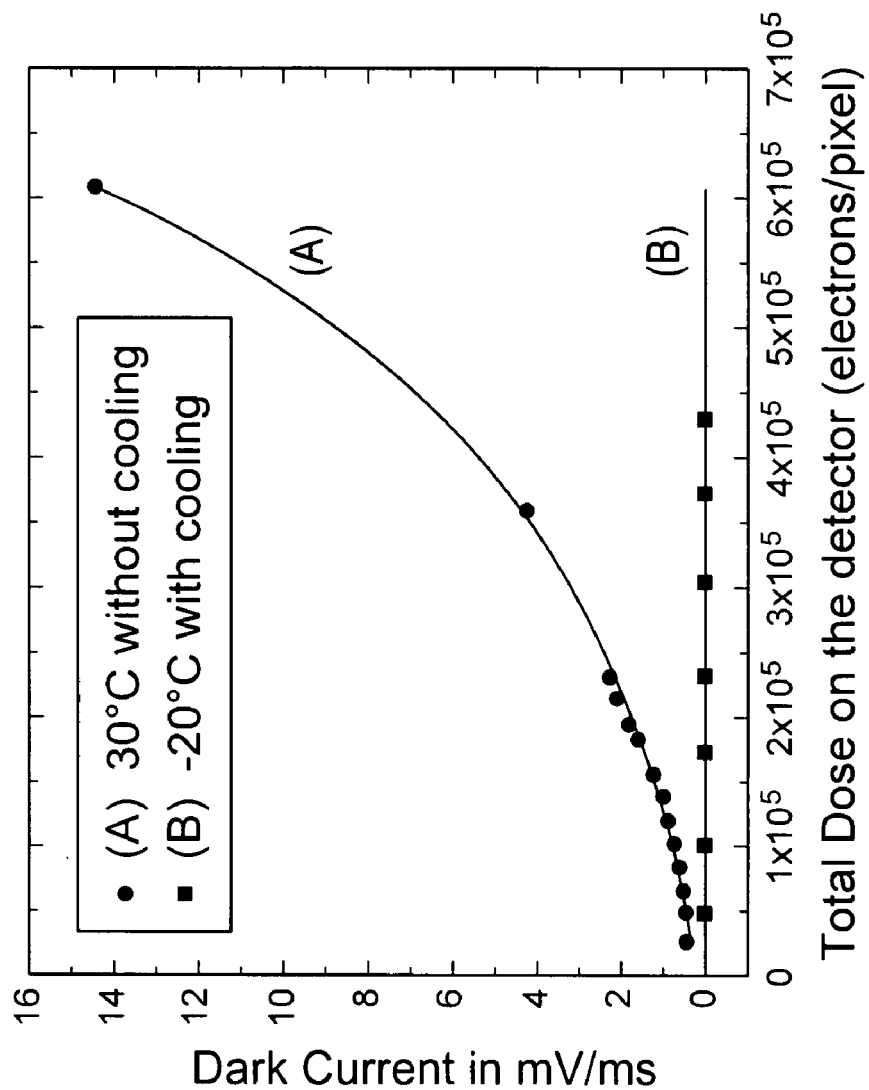
FIG. 8 plots results from experiments showing the beneficial effect of cooling an active pixel detector array of the invention to reduce the effect of dark current noise.

FIG. 8 illustrates the beneficial effect achieved by cooling. Trace A (without cooling, chip at 33° C.) FIG. 8 shows dark current in relation too the total dose of electrons (the dark current per ms. is measured by the voltage (mv) across the photodiode). The dark current increases by forty fold at a fluence of $6.5 \times 10^5$ electron/pixel. Interestingly enough, even at that fluence the signal is only reduced by 20%, still very high above the noise. Thus, the active pixel detector can operate without cooling. However, improved performance can be achieved with cooling. Cooling can reduce the dark current to a reasonable level, permitting continued use of an active pixel detector of the invention even at high radiation doses.

Trace B shows the effect of cooling. The dark current was reduced to a very small value (0.013 mv/ms) and stayed the same for a large range of radiation dose. Additionally, the signal remained at 100% even after a large radiation dose and the signal to noise ratio stayed constant during the test, as seen in Table 4 below.

TABLE 4

Chip with 512 × 550 pixels of 5 μm pitch

| | | $Y_1$ | $Y_2$ | $Y_3$ | $Y_4$ | $Y_5$ | $Y_6$ | $Y_7$ |
|---|---|---|---|---|---|---|---|---|
| Average distribution of single | $X_1$ | 0 | 0 | 1 | 1 | 1 | 1 | 0 |
| electron events at 300 keV before | $X_2$ | 1 | 1 | 2 | 3 | 2 | 1 | 1 |
| radiation damage test. Chip is | $X_3$ | 1 | 2 | 9 | 17 | 8 | 2 | 1 |
| maintained at −20° C. | $X_4$ | 1 | 3 | 17 | 81 | 17 | 3 | 1 |
| Signal to Noise Ratio = | $X_5$ | 1 | 2 | 8 | 17 | 8 | 2 | 1 |
| 214/(3.2 * sqrt(25)) ≈ 13:1 | $X_6$ | 0 | 1 | 2 | 3 | 2 | 1 | 1 |
| | $X_7$ | 0 | 1 | 1 | 1 | 1 | 1 | 0 |

| | | $Y_1$ | $Y_2$ | $Y_3$ | $Y_4$ | $Y_5$ | $Y_6$ | $Y_7$ |
|---|---|---|---|---|---|---|---|---|
| Average distribution of single | $X_1$ | 0 | 0 | 1 | 1 | 1 | 0 | 1 |
| electron events at 300 keV after | $X_2$ | 1 | 1 | 2 | 3 | 2 | 1 | 1 |
| radiation damage test (estimated | $X_3$ | 1 | 2 | 8 | 16 | 8 | 2 | 1 |
| total dose: $4.3 \times 10^5$ | $X_4$ | 1 | 3 | 17 | 82 | 17 | 3 | 1 |
| electrons/pixel). | $X_5$ | 1 | 2 | 8 | 17 | 8 | 2 | 1 |
| Signal to Noise Ratio = | $X_6$ | 1 | 1 | 2 | 2 | 1 | 1 | 0 |
| 211/(3.2 * sqrt(25)) ≈ 13:1 | $X_7$ | 0 | 0 | 0 | 1 | 0 | 0 | 0 |

The results show that at −20° C., even with a radiation dose an order of magnitude larger than $6 \times 10^5$ electrons/pixel that the signal to noise ratio is maintained. Thus, with cooling, an active pixel detector of the invention can operate with a very high signal to noise ratio and in typical transmission electron microscope conditions for extended periods without regeneration or replacement, e.g., six months or even a year depending upon the microscope usage.

Additionally, an active pixel detector of the invention used in a transmission electron microscope can be regenerated. Annealing at about 100° C. for about 5 days reverses the effect of the radiation damage.

Additional embodiment active pixel detectors of the invention have extended lifetimes due to the incorporation of radiation hardening. Radiation hardening can be accomplished in the circuits near the photodiode using closed-gate transistors in addition to guard rings. Also, another way to reduce the influence of the dark current is to further increase the digitization procedures and the read out speed, e.g., a readout speed of 100 frames per second for a large chip, e.g., 3.5K×4K pixel.

In other embodiments, the active pixel detector can be protected by active mechanisms within the microscope. In addition to off-axis techniques, another technique is to use a mechanical shutter that will only open at low beam intensities.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for transmission electron microscopy, the method comprising steps of:
   generating a microscopy signal;
   detecting the microscopy signal with an active pixel detector, the active pixel detector comprising a plurality of pixels, each pixel comprising at least one photodiode pixel and each pixel integrating an incident signal over a collection time period.

2. The method according to claim 1, wherein said plurality of pixels comprises an array of at least 250×250 pixels.

3. The method according to claim 2, wherein said pixels have an approximate 5 μm pixel size.

4. The method of claim 1, further comprising a step of periodically reading out charge from said plurality of pixels with an exposure time of approximately 100 mS or less.

5. The method of claim 1, further comprising a step of reducing the effect of dark current accumulation in said active pixel detector.

6. The method of claim 5, wherein said step of reducing comprises cooling said active pixel detector.

7. The method of claim 5, wherein said step of reducing comprises shuttering to limit the energy reaching said active pixel detector.

8. The method of claim 1, further comprising a step of re-generating said active pixel detector.

9. The method of claim 1, further comprising a step of reading out a plurality of frames from said plurality of pixels and digitally integrating the frames.

10. The method of claim 9, wherein a read out time for said step of reading is set such that a single electron or no electron is read from each pixel in each frame.

11. A detector assembly for an electron microscope, the assembly comprising:
   an active pixel detector according to claim 1; and
   supporting structure to mount said active pixel detector in an electron microscope.

12. The detector assembly of claim 11, wherein said supporting structure is configured to replace a film drawer or a CCD camera of the electron microscope.

13. The detector assembly of claim 12, wherein said supporting structure comprises:
   an assembly configured to fit into the film drawer area of an electron microscope;
   a board held in said assembly that mounts said active pixel detector;
   a door; and
   an input/output connection through said door.

14. An active pixel detector for transmission electron microscopy, the active pixel detector comprising:
   a substrate having a thickness of approximately 30 μm or less;
   a plurality of pixels, each pixel including at least one photodiode to collect charge from an incident transmission electron microscopy signal; and read-out circuitry implemented upon said plurality of pixels.

15. The active pixel detector of claim 14, wherein said pixels have a pitch of less than 20 µm.

16. The active pixel detector of claim 14, wherein said pixels have a pitch of approximately 5 µm or less.

17. The active pixel detector of claim 16, wherein said plurality of pixels comprises an array of at least 500×500 pixels.

18. The active pixel detector of claim 17, comprising an array of at least 3.5K×4K pixels.

* * * * *

UNITED STATES PATENT AND TRADEMARK OFFICE
CERTIFICATE OF CORRECTION

PATENT NO. : 7,262,411 B2  Page 1 of 1
APPLICATION NO. : 11/295148
DATED : August 28, 2007
INVENTOR(S) : Nguyen-Huu et al.

It is certified that error appears in the above-identified patent and that said Letters Patent is hereby corrected as shown below:

On the Title Page:

No. (75)  Please add the inventor --Peter Denes, Walnut Creek, CA (US)--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,262,411 B2 Page 1 of 1
APPLICATION NO. : 11/295148
DATED : August 8, 2007
INVENTOR(S) : Xuong Nyguen-Huu et al.

It is certified that error appears in the above-identified patent and that said Letters Patent is hereby corrected as shown below:

Col. 1 Line 3-4 Please add the following Statement of Government Interest after the Title:

--STATEMENT OF GOVERNMENT INTEREST

The invention was made with Government assistance under Department of Energy Management and Operations contracts for the operation of Berkeley Lab, Contract Nos. DE-AC03-76SF00098 and DE-AC02-05CH11231, and under National Institute of Health Award Nos. RR018841 and RR004050. The Government has certain rights in this invention.--

Signed and Sealed this

Thirteenth Day of April, 2010

David J. Kappos
*Director of the United States Patent and Trademark Office*

US007262411C1

(12) INTER PARTES REEXAMINATION CERTIFICATE (993rd)
United States Patent
Nguyen-Huu et al.

(10) Number: US 7,262,411 C1
(45) Certificate Issued: Nov. 10, 2014

(54) DIRECT COLLECTION TRANSMISSION ELECTRON MICROSCOPY

(75) Inventors: Xuong Nguyen-Huu, San Diego, CA (US); Mark H. Ellisman, Solana Beach, CA (US); Stuart Kleinfelder, Irvine, CA (US); Peter Denes, Walnut Creek, CA (US)

(73) Assignee: United States Department of Energy, Washington, DC (US)

Reexamination Request:
No. 95/001,313, Feb. 17, 2010

Reexamination Certificate for:
Patent No.: 7,262,411
Issued: Aug. 28, 2007
Appl. No.: 11/295,148
Filed: Dec. 6, 2005

Certificate of Correction issued May 13, 2008
Certificate of Correction issued Apr. 13, 2010

Related U.S. Application Data

(60) Provisional application No. 60/634,408, filed on Dec. 8, 2004.

(51) Int. Cl.
*H01J 37/22* (2006.01)

(52) U.S. Cl.
USPC .......................................... 250/310; 250/397

(58) Field of Classification Search
USPC ........................................................ 250/310
See application file for complete search history.

(56) References Cited

To view the complete listing of prior art documents cited during the proceeding for Reexamination Control Number 95/001,313, please refer to the USPTO's public Patent Application Information Retrieval (PAIR) system under the Display References tab.

*Primary Examiner* — James Menefee

(57) ABSTRACT

A preferred method for transmission electron microscopy includes a step of generating a microscopy signal. The microscopy signal is then detected with an active pixel detector that includes a plurality of pixels. Each of the pixels includes at least one photodiode. Each pixel integrates an incident signal over a collection time period. Using a massively parallel on chip analog to digital conversion, very fast read out times can be achieved, e.g., many frames per second. In a preferred embodiment, the read out time permits there to be a single electron event recorded per pixel, indicating either a single electron or the lack thereof. This permits simple accumulation of the pixel counts for each pixel in read-out and storage electronics.

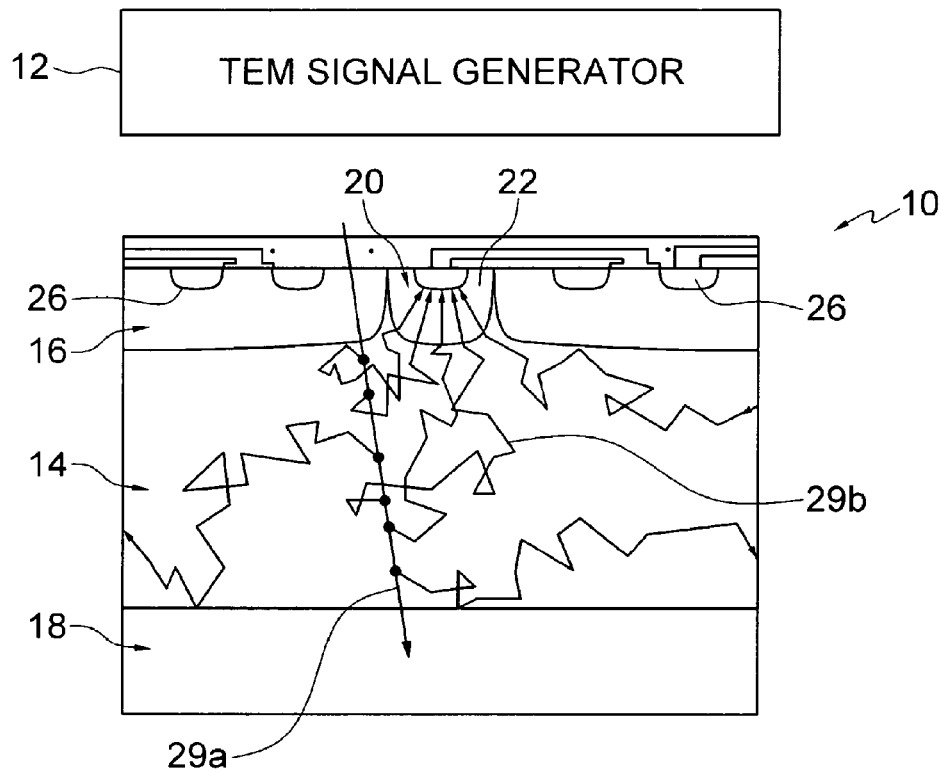

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-18 are cancelled.

\* \* \* \* \*